United States Patent [19]

Whitlow et al.

[11] Patent Number: 4,863,804
[45] Date of Patent: Sep. 5, 1989

[54] SUPERCONDUCTOR WIRE AND METHODS OF CONSTRUCTING SAME

[75] Inventors: Graham A. Whitlow; Alan T. Male, both of Murrysville; Aleksander I. Braginski, Pittsburgh, all of Pa.

[73] Assignee: Westinghouse Electric Corporation, Pittsburgh, Pa.

[21] Appl. No.: 802,900

[22] Filed: Nov. 29, 1985

[51] Int. Cl.$^4$ ............................................. H01L 39/24
[52] U.S. Cl. ...................................... 428/555; 428/556; 29/599; 174/125.1; 505/887
[58] Field of Search ................ 428/555, 556, 558, 564, 428/627, 930; 335/216; 174/126 S, 128 S; 29/599

[56] References Cited

U.S. PATENT DOCUMENTS

| | | | |
|---|---|---|---|
| 3,502,789 | 3/1970 | Barber et al. | |
| 3,910,802 | 10/1975 | Wong | 148/32 |
| 3,922,769 | 12/1975 | Brenan | |
| 3,930,903 | 1/1976 | Randall et al. | 148/32 |
| 4,200,767 | 4/1980 | Nomura et al. | 174/126 S |
| 4,242,536 | 12/1980 | Young | 174/128 S |
| 4,402,768 | 9/1983 | Flukiger | 148/11.5 F |
| 4,411,959 | 10/1983 | Braginski et al. | 428/558 |
| 4,419,125 | 11/1983 | Charles et al. | |
| 4,506,109 | 3/1985 | Onishi et al. | 174/128 S |
| 4,531,982 | 7/1985 | Dubots | 148/11.5 F |

FOREIGN PATENT DOCUMENTS

| | | | |
|---|---|---|---|
| 2752990 | 5/1979 | Fed. Rep. of Germany | 428/558 |
| 5215290 | 4/1977 | Japan | 428/558 |

Primary Examiner—John F. Terapane
Assistant Examiner—Eric Jorgensen

[57] ABSTRACT

Superconductor wire, and methods of constructing same, including one or more filaments formed of submicron-particle superconductor powder each surrounded by an encapsulating sheath having a composite wall. The composite wall includes a ductile outer skin surrounding a relatively harder, higher yield strength inner wall portion. The harder, higher strength inner wall portion improves dimensional uniformity of the filaments as the wire is fabricated, with the potential for enhanced superconducting performance, while the ductile outer skin enhances metallurgical bonding between the outer skins of adjacent filaments, to ensure a homogenous, thermally conductive and normally electrically conductive matrix.

22 Claims, 6 Drawing Sheets

|— 0.040 in. —|

FIG. 12

|— 0.040 in. —|

SUPERCONDUCTOR WIRE AND METHODS OF CONSTRUCTING SAME

BACKGROUND OF THE INVENTION

1. Field of the Invention

The invention relates in general to superconductor wire, and more specifically to superconductor wire having microparticle superconductor filaments having improved retention of filament dimensional integrity.

2. Description of the Prior Art

U.S. Pat. No. 4,411,959, which is assigned to the same assignee as the present application, teaches a submicron-particle ductile superconductor wire wherein the submicron particles are encapsulated in a metallic tube, such as copper, and then fabricated to a fine wire in the absence of sintering or reaction annealing. Bundling and fabricating the bundle produces multifilamentary composites which retain the fluid-like properties of the unsintered, submicron particle superconductor filaments.

While multifilamentary wires constructed according to the teachings of the hereinbefore mentioned U.S. patent possess excellent mechanical and electrical properties, metallographic evaluation of the wires indicates that the original circular cross-section of the filaments in the starting product is not retained during the many fabricating steps required to produce the final product. At some point in the various processing steps, the filaments become distorted and exhibit dimensional nonuniformity, both in cross-section and lengthwise.

If the filaments could be made dimensionally more uniform, superconductor behavior could be optimized, i.e., current carrying capacity would not be reduced by excessive necking down of a filament, and local heating leading to normalization and current jumping from filament to filament would not occur due to nonuniform thickness of the nonsuperconductive matrix between filaments.

SUMMARY OF THE INVENTION

Briefly, the present invention provides the desired dimensional uniformity of submicron-particle ductile superconductor filaments by partial substitution of a harder, higher mechanical strength alloy sheath for the substantially pure metal utilized in the matrix of the hereinbefore mentioned U.S. patent. In effect, the sheath surrounding each filament has a composite wall, retaining a relatively soft, ductile outer skin for promoting metallurgical bonds with like skins of adjacent filaments, while directly surrounding the filament with a higher strength inner wall portion. For example, the skin may be substantially pure copper or aluminum, and the inner wall may be dispersion hardened copper or aluminum.

BRIEF DESCRIPTION OF THE DRAWING

The invention may be better understood and further advantages and uses thereof more readily apparent, when considered in view of the following detailed description of exemplary embodiments, taken with the accompanying drawings, in which.

DESCRIPTION OF THE PREFERRED EMBODIMENTS

In order to limit the length and complexity of the present application the hereinbefore mentioned U.S. Pat. Nos. 4,411,959, and 4,419,125 are hereby incorporated into the specification of the present application by reference. U.S. Pat. No. 4,411,959 teaches how a submicron-particle ductile superconductor wire may be fabricated, and U.S. Pat. No. 4,419,125 teaches a method which may be used to prepare submicron-superconductor particles suitable for use in the superconductor wire.

Figure 1:
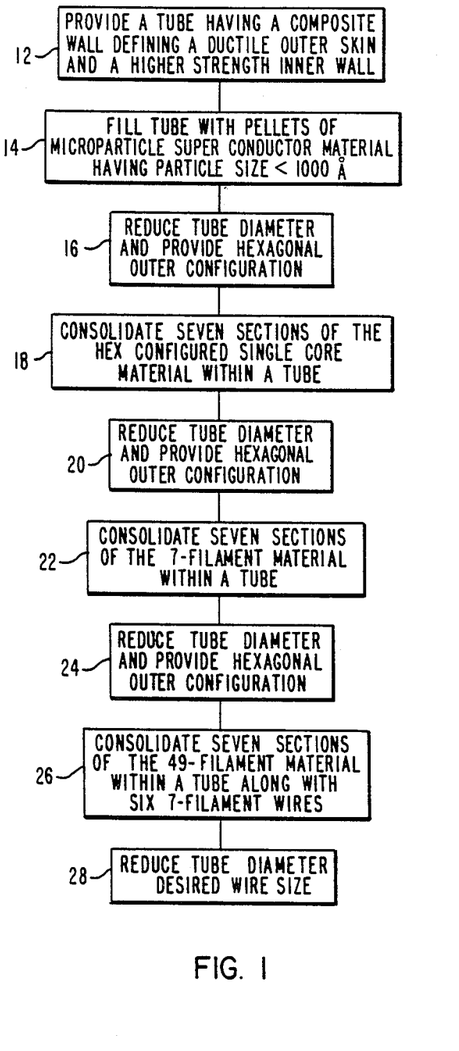
FIG. 1 is a block diagram which sets forth the steps of constructing a submicron-particle ductile superconductor wire having improved dimensional uniformity of the superconductor filaments, according to the teachings of the invention.
Figure 2:
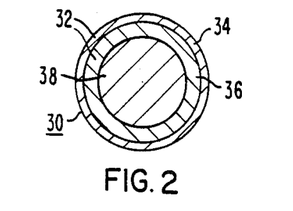
FIG. 2 is a cross-sectional view of the starting product constructed according to the teachings of the invention, including a tubular member having a composite wall containing a precompacted plug of submicron superconductor powder.
Figure 3A:
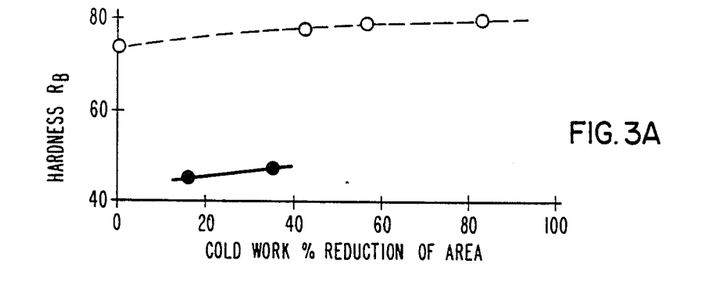
FIGS. 3A, 3B and 3C are graphs which compare the mechanical properties of OFHC copper and dispersion hardened copper.
Figure 3B:
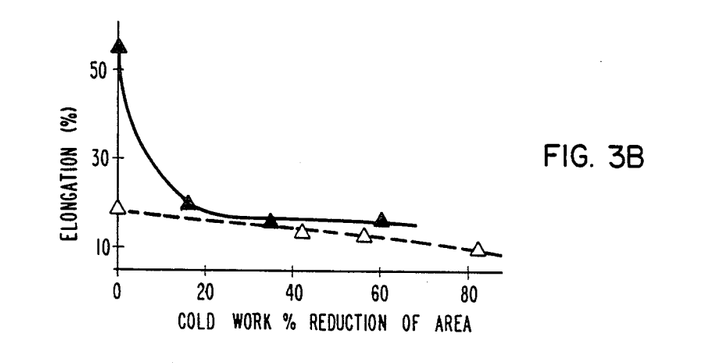
Figure 3C:
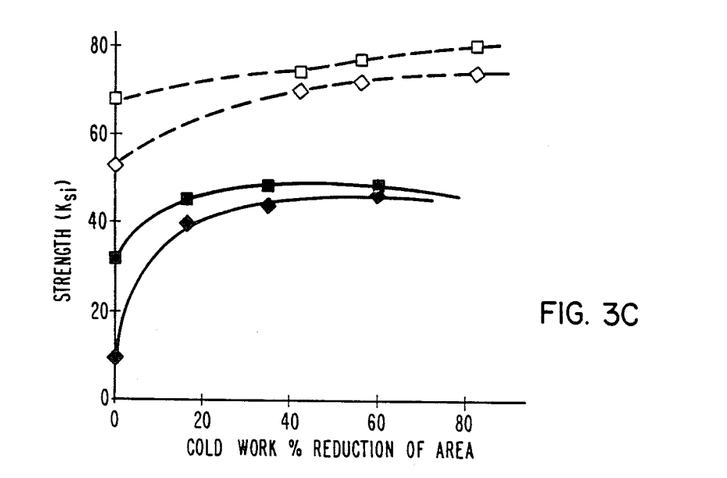

FIG. 1 is a block diagram outlining the steps of a new and improved method of fabricating submicronparticle ductile superconductor wire according to the teachings of the invention. Step 12 provides a tubular member having a composite wall defining a ductile outer skin and a harder, higher strength inner wall. As shown in FIG. 2, which is a cross-sectional view of the starting product, a metallic tube 30 is provided having a wall 32. Tube 30 has a round outside diameter, such as 0.375 inch (9.5 mm) for example, and a round inside diameter such as 0.241 inch (6.1 mm), for example. Wall 32, instead of being formed entirely of a ductile, substantially pure metal, such as copper or aluminum, is a composite, having an outer skin 34 of substantially pure metal which is nonsuperconductive at the low temperature of interest, i.e., a "normal" conductor. Skin 34 may be oxygen free, high conductivity (OFHC) copper, or aluminum, for example. Skin 34, which may be typically 0.010 inch (0.25 mm) thick, surrounds and is in intimate metallurgical contact with a harder, higher mechanical yield strength inner wall portion 36. In a preferred embodiment, inner wall portion 36 is a dispersion hardened alloy of the same metal of which the skin 34 is formed. For example, if skin 34 is copper, inner wall 36 may be dispersion hardened copper, such as by 0.2 weight percent (w/o) of alumina ($Al_2O_3$). A pure copper matrix containing finely dispersed, submicroscopic particles of alumina is harder and has a higher mechanical yield strength than pure copper, as the particles act as a barrier to dislocation movement. FIGS. 3A, 3B and 3C are graphs which compare the mechanical properties of OFHC copper and Glidden Metal's oxide dispersion strengthened copper (AL-20), as a function of cold work of a one-inch diameter rod. The solid symbols represent the OFHC copper and the open symbols the dispersion strengthened copper. Copper may also be hardened by other oxides, such as BeO, $ZrO_2$, $SiO_2$, TiO, $Y_2O_3$, $Cr_2O_3$ and $Th_2O_3$, by carbides such as SiC, BC, or mixtures thereof, and also copper alloys with Nb, Ta or mixtures thereof. The additives will typically be in the range of 0.01–1.0 w/o. If the skin 34 is aluminum, inner wall 36 may be aluminum which has been dispersion hardened with about 0.01–1.0 w/o alumina, or other suitable dispersions. The inner wall may also be a high strength, high conductivity alloy, such as Al-Fe.

As set forth in step 14 of FIG. 1, tube 30 is then filled with precompacted pellets 38 of microparticle superconductor or powder, such as niobium stannide ($Nb_3Sn$), niobium aluminide ($Nb_3Al$), niobium carbide (NbC), niobium carbonitride Nb (N, C), $Nb_3$ (Sn, X) and $Nb_3$ (Al, X), where X may be any one of several elements, such as germanium. The particle size should be submicron in order to impart fluid-like characteristics to the superconductor core or filament and thus provide a strong, flexible wire which may be used in high field superconductor magnets, for example. The average particle dimension should be less than 1000 Angstroms, preferably with significant contribution from 100 Angstrom sizes, and its form should ideally be spherical. Step 12 also includes plugging and swaging the open end of the tube after being filled with pellets 38.

Figure 4:
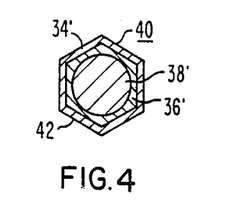
FIG. 4 is a cross-sectional view of a wire produced after the starting product has been reduced in diameter and changed to a hexagonal outer configuration.

Step 16 reduces the diameter of tube 30 and changes the round outer configuration to hexagonal, as shown in FIG. 4. As used herein, the term "reducing the diameter of a tube" includes any method such as drawing through a die, rolling, and the like, with suitable intermediate anneals, such as one-half hour at 450° C. in an inert atmosphere, such as argon. For example, the filled tube 30 may be cold swaged through a series of dies down to 0.150 inch (3.8 mm) diameter round wire in steps of 0.20 inch (0.5 mm), with a final anneal at 450° C. for one-half hour in argon. The round wire may then be cold extruded from round to hexagonal cross-sectional configuration by one pass to 0.120 inch (3 mm) hex to provide the single core hex-shaped wire 40 shown in FIG. 4. Core 38' of the superconductor particles has round cross-section, while the encapsulating sheath 42 has a hexagonal outer configuration. The inside surface of the resulting high strength inner wall 36' conforms to the round core 38', while the outer skin 34 has the hexagonal cross-sectional configuration.

Figure 5:
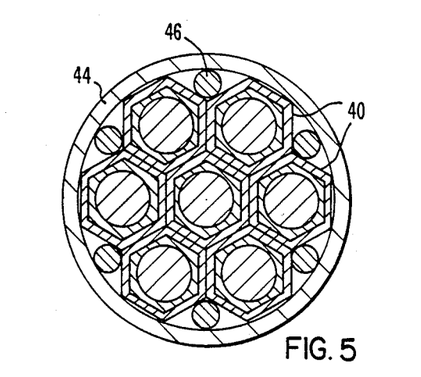
FIG. 5 is a cross-sectional view illustrating the bundling of a plurality of single-core hexagonal configured wires shown in FIG. 3.

As shown in FIG. 5, step 18 bundles and consolidates seven of the single-core wires 40 within a OFHC thin walled copper tube 44 also containing six OFHC copper filler wires 46 typically 0.40 inch (1.0 mm) diameter. For example, copper tube 44 may have an outside diameter of 0.5 inch (12.7 mm) with a bore of 0.368 inch (9.3 mm). The consolidation may be performed by hot isostatic pressing, e.g., 900° C. for two hours at 15 ksi.

Figure 6:
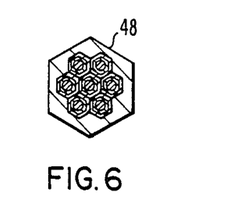
FIG. 6 is a cross-sectional view of wire produced after the bundled product shown in FIG. 4 has been reduced in diameter and reconfigured to a hexagonal outer configuration.

Step 20 reduces the diameter of tube 44, such as to 0.390 inch (9.9 mm), and then cold extrudes the round cross-sectional configuration to 0.120 inch (3 mm) hex to provide the 7-filament wire 48 shown in FIG. 6.

Figure 7:
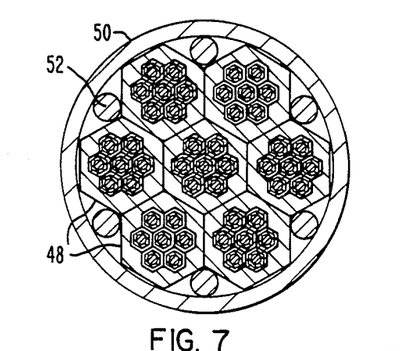
FIG. 7 is a cross-sectional view illustrating the bundling of a plurality of multifilament, hexagonal wires shown in FIG. 5.

As shown in FIG. 7, step 22 bundles and consolidates seven of the 7-filament wires 48 within a 0.5 inch (12.7 mm) diameter OFHC copper tube 50 having a 0.368 inch (9.3 mm) bore. Copper wires 52 fill the voids between the 7-filament wires 48 and the inside wall of tube 50.

Figure 8:
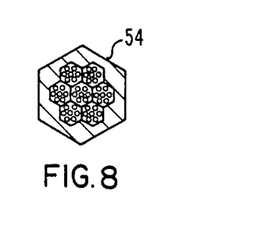
FIG. 8 is a cross-sectional view of the wire produced after the bundled product shown in FIG. 6 has been reduced in diameter and reconfigured to a hexagonal outer configuration.

Step 24 reduces the diameter of tube 50 to 0.390 inch (9.9 mm), and then cold extrudes the resulting round wire to 0.120 inch (3 mm) hex to provide the 49-filament wire 54 shown in FIG. 8.

Figure 9:
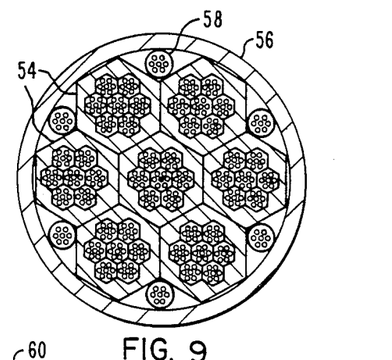
FIG. 9 is a cross-sectional view illustrating the bundling of a plurality of multifilamentary, hexagonally configured wires shown in FIG. 7.

As shown in FIG. 9, step 26 bundles and consolidates seven of the 49-filament wires 54 within a 0.5 inch (12.7 mm) diameter OFHC copper tube 56. Six OFHC copper wires 58 each containing seven superconductor filaments may fill the voids between wires 54 and the inside wall of tube 56.

Figure 10:
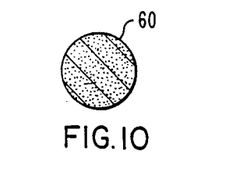
FIG. 10 is a cross-sectional view of the final multifilamentary wire product produced by reducing the diameter of the bundle shown in FIG. 8.

As shown in FIG. 10, step 28 then reduces the diameter of tube 56 to the desired diameter 385-filament wire 60. Cold hydrostatic extrusion drawing, as described in U.S. Pat. No. 3,922,769, may be used for the final pass to the desired diameter, such as 0.030 inch OD (0.76 mm).

Figure 11:
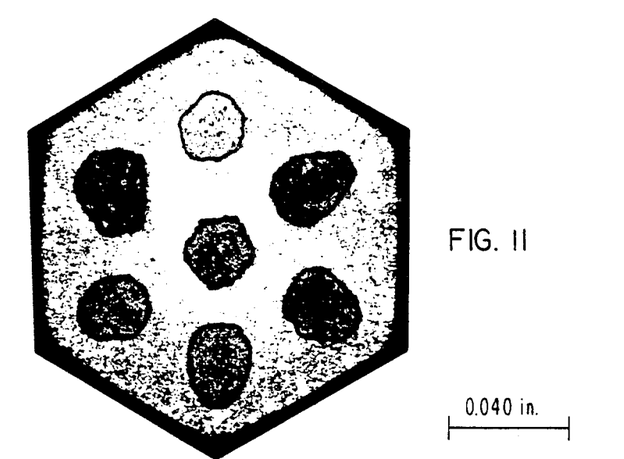
FIG. 11 is an optical microscope photograph of a multifilamentary superconductor wire constructed according to the teachings of the prior art.
Figure 12:
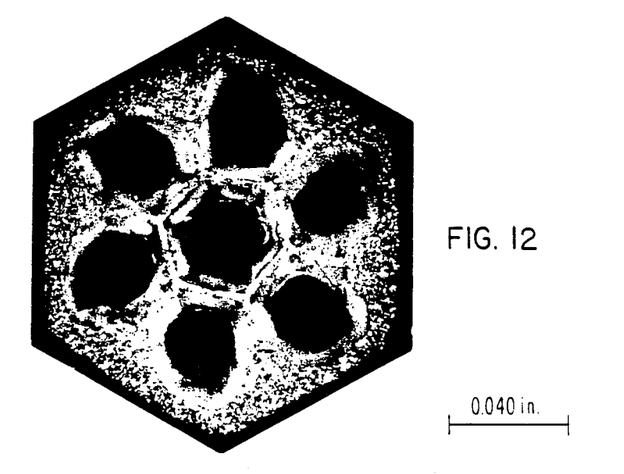
FIG. 12 is an optical microscope photograph of a multifilamentary superconductor wire constructed according to the teachings of the invention.

FIG. 11 is an optical microscope photograph of a 7-filament, hexagonal section microparticle superconductor wire, which has been constructed according to prior art teachings wherein the filaments are compacted microparticle NbC powder and the matrix is OFHC copper. FIG. 12 is an optical microscope photograph of a 7-filament, hex section microparticle superconductor wire constructed according to the teachings of the invention, such as the wire 48 shown in FIG. 6, wherein the filaments are microparticle NbC powder and the matrix includes oxide dispersion strengthened copper immediately surrounding each filament with an outer skin of OFHC copper. It will be noted that the filaments are not as nonuniform in cross-section or as egg-shaped. Additionally, longitudinal sections prepared by optical metallography reveal less necking down or longitudinal variations than shown by the prior art. The partial replacement of the OFHC copper in the sheath about each filament with a higher yield strength material results in higher current density cores or filaments with greater reliability, sacrificing only a minimal reduction in the normal state electrical conductivity of the nonsuperconductor portion of the wire.

Figure 13:
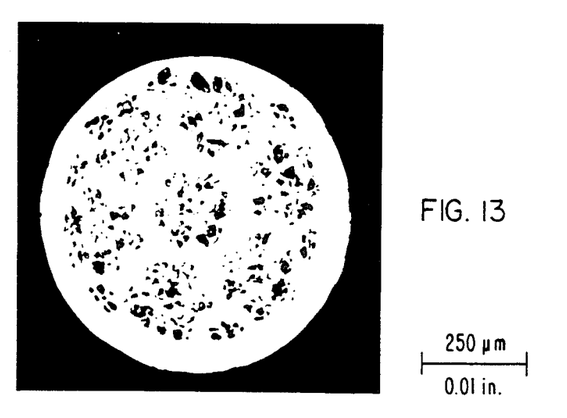
FIG. 13 is an optical microscope photograph illustrating a cross-section of a 385 filament wire constructed according to the teachings of the prior art.
Figure 14:
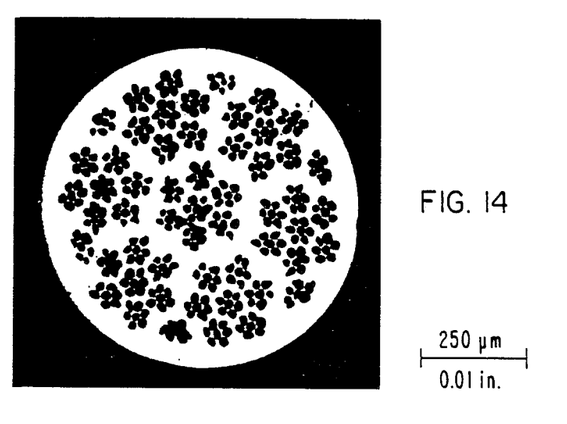
FIG. 14 is a photograph similar to FIG. 13, except illustrating a cross-section of a 385 filament wire constructed according to the teachings of the invention.

Metallographic evaluation of several 0.30 inch (0.76 mm) diameter, 385 filament, microparticle, multifilamentary superconductor wires, such as the wire 60 shown in FIG. 10, clearly demonstrates the improved dimensional uniformity of the filaments. Typical cross-sectional micrographs of cold worked wires, with and without the oxide dispersion strengthened copper matrix, are respectively shown in FIGS. 13 and 14. In each wire, the seven, 49-filament bundles and six peripherally located, 7-filament filler wires may be clearly distinguished. Within each bundle, the seven, 7-filament groupings are also apparent. Comparison of the cross sections shown in FIGS. 13 and 14 clearly shows the enhancement in filament dimensional uniformity which may be achieved with the oxide dispersion strengthened copper matrix. The presence of the oxide dispersion strengthened material in the sheath about each filament has resulted in remarkable identity retention for each individual filament, providing the almost complete filament isolation pattern shown in FIG. 14, and in the retention of a more uniform cross section, when compared with the wire shown in FIG. 13, which was fabricated with OFHC Copper in the matrix.

Figure 15:
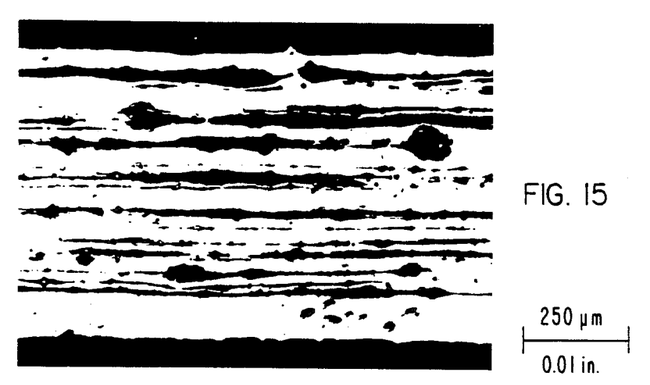
FIG. 15 is an optical microscope photograph illustrating a longitudinal section of a 385 filament wire constructed according to the teachings of the prior art.
Figure 16:
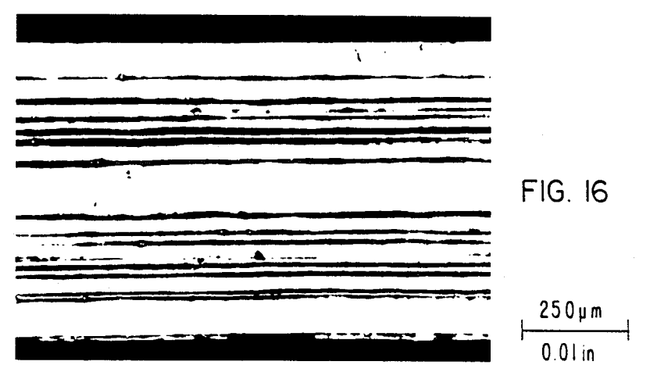
FIG. 16 is a photograph similar to FIG. 15, except illustrating a longitudinal section of a 385 filament wire constructed according to the teachings of the invention.

Longitudinal sectional micrographs of 0.30 inch (0.76 mm) diameter, 385 filament wires, with and without the oxide dispersion strengthened copper matrix, are respectively shown in FIGS. 15 and 16. The enhancement of longitudinal filament dimensional uniformity is clearly shown, i.e., the necking down or pinching of the filaments is substantially reduced in the wire of FIG. 16, which has the oxide dispersion strengthened matrix.

We claim as our invention:

1. A superconductor wire, comprising:
 a plurality of filaments formed of submicron-particle superconductor powder,
 and an encapsulating metallic sheath disposed about each said filament,
 each of said encapsulating sheaths having a composite wall including a ductile outer skin surrounding a harder, higher yield strength inner wall portion, with said harder inner wall portion improving dimensional uniformity of the filament during subsequent fabrication of the wire.

2. The superconductor wire of claim 1 wherein the skin of the composite wall is substantially pure copper and the inner wall portion is dispersion hardened copper.

3. The superconductor wire of claim 1 wherein the submicron particles are niobium stannide.

4. The superconductor wire of claim 1 wherein the submicron particles are niobium carbide.

5. The superconductor wire of claim 1 wherein the submicron particles are niobium aluminide.

6. The superconductor wire of claim 1 wherein the submicron particles are niobium carbonitride.

7. The superconductor wire of claim 1 wherein the outer skin of the composite wall is substantially pure copper and the inner wall is copper which has been dispersion hardened with alumina.

8. The superconductor wire of claim 1 wherein the outer skin of the composite wall is substantially pure copper and the inner wall is copper which has been dispersion hardened by an additive selected from the group consisting of $BeO$, $Al_2O_3$, $ZrO_2$, $SiO_2$, $TiO$, $Y_2O_3$, $Cr_2O_3$, $Th_2O_3$, SiC, BC, Nb, Ta, and mixtures thereof.

9. The superconductor wire of claim 1 wherein the outer skin of the composite wall is substantially pure aluminum, and the inner wall is dispersion hardened aluminum.

10. A multifilament superconductor wire, comprising:
 a plurality of filaments formed of submicronparticle superconductor powder, and an encapsulating metallic sheath disposed about each filament,
 at least certain of said encapsulating sheaths having a composite wall including a ductile outer skin which surrounds a harder, higher yield strength inner wall portion, with said ductile outer skin of each filament being metallurgically bonded to the ductile outer skins of adjacent filaments, and with said harder inner wall portion improving the dimensional uniformity of its associated filament.

11. The superconductor wire of claim 10 wherein the skin of the composite wall is substantially pure copper, and the inner wall portion is dispersion hardened copper.

12. The superconductor wire of claim 10 wherein the submicron particles are niobium aluminide.

13. The superconductor wire of claim 10 wherein the submicron particles are niobium stannide.

14. The superconductor wire of claim 10 wherein the submicron particles are niobium carbide.

15. The superconductor wire of claim 10 wherein the submicron particles are niobium carbonitride.

16. The superconductor wire of claim 10 wherein the outer skin of the composite wall is substantially pure copper and the inner wall is copper which has been dispersion hardened with alumina.

17. The superconductor wire of claim 10 wherein the outer skin of the composite wall is substantially pure copper, and the inner wall is copper dispersion hardened by an additive selected from the group consisting of $BeO$, $Al_2O_3$, $ZrO_2$, $SiO_2$, $TiO$, $Y_2O_3$, $Cr_2O$, $Th_2O_3$, SiC, BC Nb, Ta, and mixtures thereof.

18. The superconductor wire of claim 10 wherein the outer skin of the composite wall is substantially pure aluminum, and the inner wall is dispersion hardened aluminum.

19. A method of constructing wire from microparticle superconductor powder to enhance filament dimensional stability, comprising the steps of:
 providing a first tubular metallic member having a composite wall defining a ductile outer skin surrounding a harder, higher yield strength inner wall portion,
 filling said first tubular member with a submicronparticle superconductor powder,
 reducing the diameter of said first tubular member to provide a single filament wire,
 providing a hexagonal cross-sectional configuration on the single-filament wire,
 bundling a plurality of the hexagonal wires in a second tubular member,
 and reducing the diameter of said second tubular member to provide a first multifilament wire.

20. The method of claim 19 wherein the step of reducing the diameter of the second tubular member includes the step of providing a hexagonal cross-sectional configuration on the multifilament wire, and including the steps of:
 bundling a plurality of the first multifilament wires in a third tubular member,
 and reducing the diameter of said third tubular member to provide a second multifilamentary wire.

21. The method of claim 20 wherein the step of reducing the diameter of the third tubular member includes the step of providing a hexagonal cross-sectional configuration on the second multifilamentary wire, and including the steps of:

bundling a plurality of the second multifilamentary wires in a fourth tubular member,
and reducing the diameter of said fourth tubular member to provide a third multifilamentary wire.

22. The method of claim 20 wherein the step of bundling a plurality of hexagonal single-filament wires includes the step of consolidating the assembly by pressing the ductile outer skins of the plurality of hexagonal wires tightly together to form a good metallurgical bond between adjacent outer skins of the corresponding hexagons.

* * * * *